United States Patent
Wang et al.

(10) Patent No.: US 8,154,051 B2
(45) Date of Patent: Apr. 10, 2012

(54) MOS TRANSISTOR WITH IN-CHANNEL AND LATERALLY POSITIONED STRESSORS

(75) Inventors: Chih-Hao Wang, Hsin-Chu (TW); Ching-Wei Tsai, Taoyuan (TW); Ta-Wei Wang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/511,622

(22) Filed: Aug. 29, 2006

(65) Prior Publication Data

US 2008/0054301 A1 Mar. 6, 2008

(51) Int. Cl.
*H01L 29/66* (2006.01)

(52) U.S. Cl. . 257/192; 257/190; 257/616; 257/E21.182; 257/E29.193

(58) Field of Classification Search ........... 257/E29.193, 257/192, 616, E21.182, 190
See application file for complete search history.

(56) References Cited

U.S. PATENT DOCUMENTS

| | | | |
|---|---|---|---|
| 6,492,216 B1 | 12/2002 | Yeo et al. | |
| 6,900,502 B2 | 5/2005 | Ge et al. | |
| 6,902,965 B2 | 6/2005 | Ge et al. | |
| 6,927,414 B2 * | 8/2005 | Ouyang et al. | 257/20 |
| 7,176,522 B2 | 2/2007 | Cheng et al. | |
| 7,208,362 B2 | 4/2007 | Chidambaram | |
| 7,229,893 B2 | 6/2007 | Wang et al. | |
| 7,298,009 B2 | 11/2007 | Yan et al. | |
| 7,323,392 B2 | 1/2008 | Wang et al. | |
| 2004/0173812 A1 * | 9/2004 | Currie et al. | 257/103 |
| 2005/0035409 A1 | 2/2005 | Ko et al. | |
| 2005/0082616 A1 * | 4/2005 | Chen et al. | 257/350 |
| 2005/0148134 A1 | 7/2005 | Dokumaci et al. | |
| 2005/0285212 A1 * | 12/2005 | Tolchinsky et al. | 257/408 |
| 2006/0014366 A1 * | 1/2006 | Currie | 438/517 |
| 2006/0081875 A1 * | 4/2006 | Lin et al. | 257/190 |
| 2006/0081876 A1 * | 4/2006 | Monfray et al. | 257/192 |
| 2006/0099752 A1 * | 5/2006 | Xiang et al. | 438/197 |
| 2007/0096149 A1 * | 5/2007 | Liu et al. | 257/192 |
| 2007/0215859 A1 * | 9/2007 | Clifton | 257/19 |

OTHER PUBLICATIONS

Uchida, K., et al., "Physical Mechanisms of Electron Mobility Enhancement in Uniaxial Stressed MOSFETs and Impact of Uniaxial Stress Engineering in Ballistic Regime," IEEE 2005, 8 pgs.
Ang, K.W., et al., "Enhanced Performance in 50 nm N-MOSFETs with Silicon-Carbon Source/Drain Regions," 2004, IEEE, 3 pages.
Ang, K.W., et al., "Thin Body Silicon-on-Insulator N-MOSFET with Silicon-Carbon Source/Drain Regions for Performance Enhancement," 2005, IEEE, 4 pages.

* cited by examiner

*Primary Examiner* — Jay C Kim
(74) *Attorney, Agent, or Firm* — Slater & Matsil, L.L.P.

(57) ABSTRACT

A strained channel transistor can be provided by combining a stressor positioned in the channel region with stressors positioned on opposite sides of the channel region. This produces increased strain in the channel region, resulting in correspondingly enhanced transistor performance.

9 Claims, 5 Drawing Sheets

MOS TRANSISTOR WITH IN-CHANNEL AND LATERALLY POSITIONED STRESSORS

TECHNICAL FIELD

The present invention relates generally to semiconductor integrated circuits and, more particularly, to strained channel transistors in semiconductor integrated circuits.

BACKGROUND

It is well known in the semiconductor art that the performance of MOS transistors can be enhanced by creating a suitable strain (also referred to herein as stress) in the channel region, thereby producing a so-called strained channel transistor. For example, the performance of an n-channel transistor can be enhanced by creating a tensile strain in the channel region of the transistor, and the performance of a p-channel transistor can be enhanced by creating a compressive strain in the channel region of the transistor.

Some conventional strained channel transistors use a stressor positioned in the channel region to create the desired stress. The use of a stressor positioned in the channel region is described, for example, in U.S. Pat. No. 6,492,216, which is incorporated herein by reference. Other conventional strained channel transistors use stressors positioned laterally of the channel to create the desired stress. The use of stressors positioned laterally of the channel is described, for example, in U.S. Patent Application Publication No. 2005/0035409, which is incorporated herein by reference.

In view of the performance advantage associated with strained channel transistors, it is desirable to provide for strained channel transistors with channel strain characteristics, and associated performance enhancements, that exceed those that are conventionally available.

SUMMARY OF THE INVENTION

Exemplary embodiments of the invention provide a stressor positioned in the channel region of the transistor, in combination with stressors positioned on opposite sides of the channel region. This produces increased strain in the channel region, resulting in correspondingly enhanced transistor performance.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Exemplary embodiments of the invention provide a stressor positioned in the channel region of an MOS transistor, in combination with stressors positioned on opposite sides of the channel region. This produces increased strain in the channel region, resulting in correspondingly enhanced transistor performance.

Figure 1:
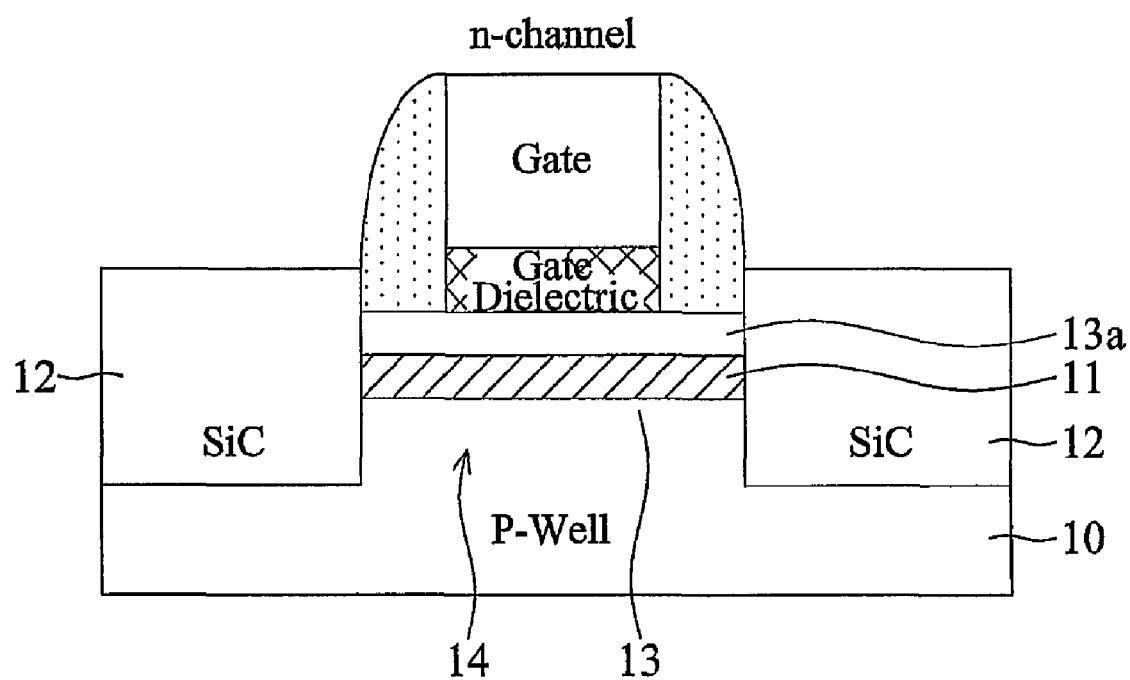
FIG. 1 diagrammatically illustrates a strained channel transistor according to exemplary embodiments of the invention.

FIG. 1 diagrammatically illustrates a strained channel transistor according to exemplary embodiments of the invention. The transistor shown in FIG. 1 is an n-channel transistor including a p-well formed in a semiconductor substrate 10, with a channel area 14. The channel area 14 of the transistor includes a portion 13 of the substrate 10, a first stressor 11 positioned over the portion 13 of the substrate 10, and a strained channel region 13a positioned over the first stressor 11. The strained channel region 13a includes a strained channel portion that permits carrier movement therethrough.

The first stressor 11 has a lattice constant that is greater than the lattice constant of the strained channel region 13a and is also greater than the lattice constant of the substrate 10. The first stressor 11 thus produces tensile stress in the strained channel region 13a and the portion 13 of substrate 10.

The transistor of FIG. 1 further includes second stressors 12 positioned on opposite sides of the channel region 14. The first stressor 11 and the strained channel region 13a contact both of the second stressors 12, and extend across the channel region 14 between the second stressors 12. Each of the second stressors 12 has a lattice constant that is less than the lattice constant of the strained channel region 13a and is also less than the lattice constant of the substrate 10. Thus, the second stressors 12 are cooperable to produce tensile stress in the strained channel region 13a and the portion 13 of the substrate 10. The cooperation of lateral stressors to produce tensile stress in a channel region is described in detail in the aforementioned U.S. Patent Application Publication No. 2005/0035409, which is incorporated herein by reference.

The second stressors 12 help to relax the first stressor 11 to recover its lattice constant, which in turn creates a higher tensile stress in the strained channel region 13a. The interaction of the first stressor 11 and the second stressors 12 produces a resultant uni-axial tensile stress on the strained channel region 13a and the portion 13 of substrate 10. This resultant tensile stress is greater than a linear combination of: (1) the tensile stress that would be produced by the first stressor 11 in the absence of the second stressors 12; and (2) the tensile stress that would be produced by the second stressors 12 in the absence of the first stressor 11. Furthermore, because this relaxation occurs from the contact regions of the first stressor 11 and the second stressors 12, the enhanced improvement is particularly significant for smaller gate length devices.

In some embodiments, the second stressors 12 are formed in the manner described in U.S. Patent Application Publication No. 2005/0035409, with the second stressors 12 of FIG. 1 generally corresponding to the stressors 118 described in U.S. Patent Application Publication No. 2005/0035409. However, before forming the second stressors 12, the material for the first stressor 11 is provided on the substrate 10. In some embodiments, the material for the first stressor 11 is grown in generally the same manner described in U.S. Pat. No. 6,492, 216, which is incorporated herein by reference, with the first stressor 11 of FIG. 1 generally corresponding to the stressor 2 in U.S. Pat. No. 6,492,216.

In some embodiments, the strained channel region 13a and substrate 10 are silicon material. In various ones of such embodiments, the first stressor 11 comprises silicon and germanium in the composition $Si_{1-x}Ge_x$, where x can take values from approximately 0.05 to approximately 1. Some embodiments use a silicon-germanium composition in a range of x=0.1~0.3 to ensure that either its lattice constant is large enough to generate tensile stress (lower bound of x), or its thermal characteristic is still similar to that of silicon (higher bound of x). In various embodiments where the substrate 10 and strained channel region 13a are silicon, the second stressors 12 comprise silicon and carbon in the composition $Si_{1-y}C_y$, where y can take values from approximately 0.001 to approximately 1.

In some embodiments where the strained channel region 13a and substrate 10 are silicon, the lattice constant of the first stressor 11 is greater than the lattice constant of silicon, but less than, for example, approximately 5.55 angstroms. In some embodiments where the strained channel region 13a and substrate 10 are silicon, the lattice constant of the second stressors 12 is less than the lattice constant of silicon, but greater than, for example, approximately 3.50 angstroms.

In various embodiments, materials such as AlP, AlAs, GaP or GaAs are used instead of Ge in the first stressor 11. In various embodiments, materials such as AlN or GaN are used instead of carbon in the second stressors 12. In various embodiments, materials such as bulk Si, Ge, SOI, GOI or SGOI are used for the substrate 10.

In some embodiments where the first stressor 11 is SiGe, the first stressor 11 has a thickness (depth) that is greater than approximately 30 angstroms. In some embodiments where the second stressors 12 are SiC, the second stressors 12 extend into the substrate 10 beyond the bottom of the first stressor 11. In some embodiments where the strained channel region 13a is silicon, the strained channel region 13a has a thickness (depth) that is greater than approximately 50 angstroms, to ensure that carriers will pass therethrough.

Figure 2:
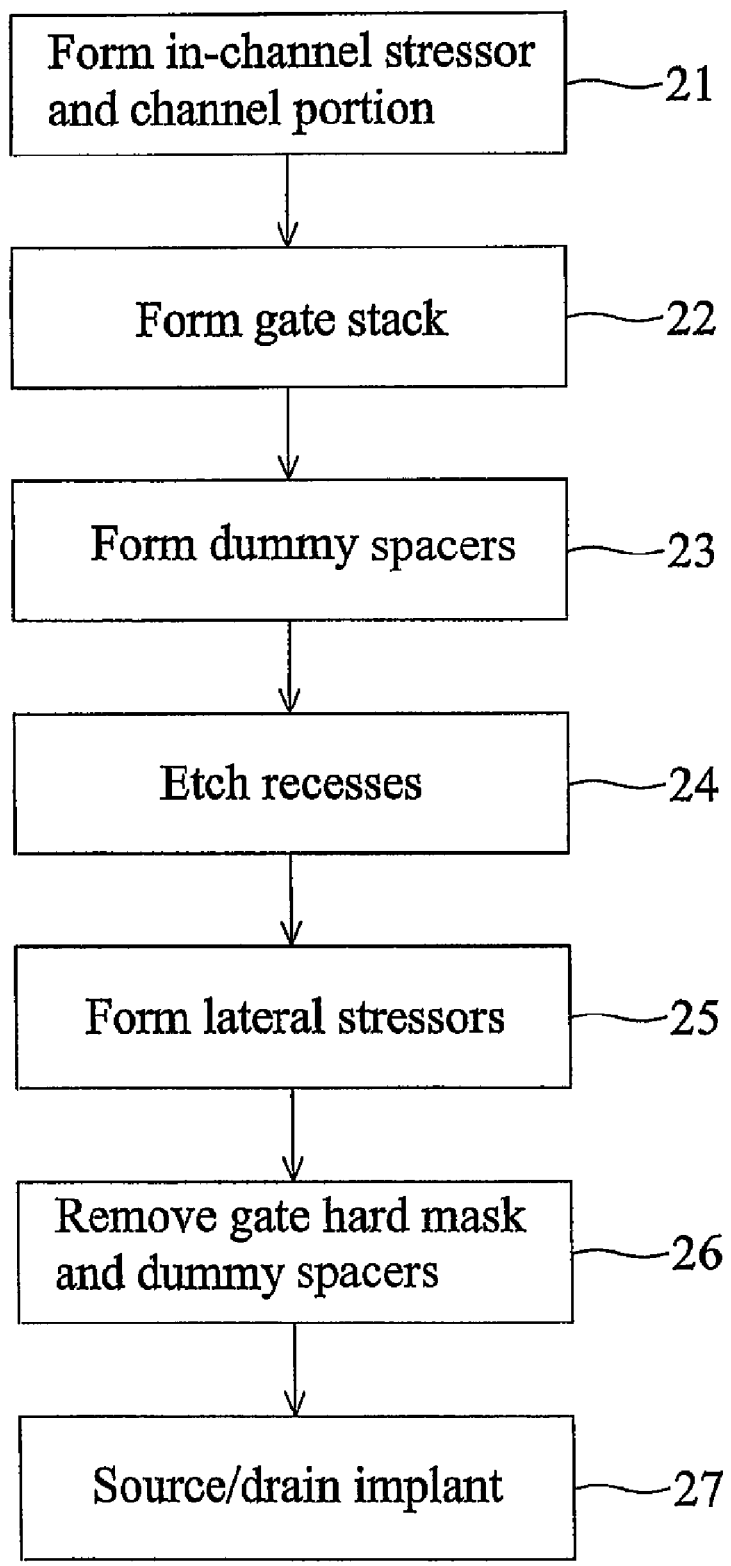
FIG. 2 illustrates a process that can be used to produce the strained channel transistor of FIG. 1 according to exemplary embodiments of the invention.

FIG. 2 illustrates pertinent portions of a process that can be used to produce the strained channel transistor of FIG. 1 according to exemplary embodiments of the invention. At 21, the first stressor 11 is formed on the substrate, and the strained channel region 13a is formed over the first stressor 11 (see also FIG. 1). In some embodiments, both the first stressor 11 and the strained channel region 13a are epitaxially grown, using techniques such as described for growing the stressor layer 2 in U.S. Pat. No. 6,492,216. After forming the strained channel region 13a, the gate stack is formed at 22. Dummy spacers are formed at 23 (in preparation for etching recesses in which the lateral stressors will be formed). In some embodiments, the gate stack and dummy spacer formation at 22 and 23 corresponds generally to the gate stack and dummy spacer formation described with respect to FIGS. 4b-4e in U.S. Patent Application Publication No. 2005/0035409, with the dummy spacers corresponding generally to spacers 158 in U.S. Patent Application Publication No. 2005/0035409. After formation of the dummy spacers at 23, the recesses for the lateral stressors are etched at 24. In some embodiments, the recess etching corresponds generally to the etching of the recessed regions 160 described in U.S. Patent Application Publication No. 2005/0035409. The lateral stressors are then formed in the recesses, as shown at 25. In some embodiments, the lateral stressors are epitaxially grown, using techniques such as described for growing the semiconductor material 162 in U.S. Patent Application Publication No. 2005/0035409. In some embodiments, an infusion technique is used to form the lateral stressors at 25.

At 26, the gate hard mask and dummy spacers are removed, after which source and drain regions are implanted at 27. For the example of an n-channel transistor (such as in FIG. 1), the source and drain regions are implanted as N+ doped regions. The source/drain implant operation 27 of FIG. 2 is shown in more detail in FIG. 4. In the source/drain implant operation illustrated in FIG. 4, with the dummy spacers removed (see 26 in FIG. 2), source and drain extensions are formed at 41, in all portions of the transistor structure not covered by the gate structure. In some embodiments, these source and drain extensions are formed by implant operations that generally correspond to the source/drain extension implant operations described with respect to FIG. 4h in U.S. Patent Application Publication No. 2005/0035409. After implantation of the source and drain extensions, main spacers are formed at 42. In some embodiments, these main spacers (illustrated at 31 in FIG. 3) correspond generally to the spacers 170 described in U.S. Patent Application Publication No. 2005/0035409. After formation of the main spacers at 42, the remainders of the source and drain regions are formed at 43, in all portions of the transistor structure not covered by the gate structure or the main spacers. In some embodiments, the remainders of the source and drain regions are formed by implant operations such as the deep source and drain implant operations described with respect to FIG. 4i in U.S. Patent Application Publication No. 2005/0035409.

Figure 3:
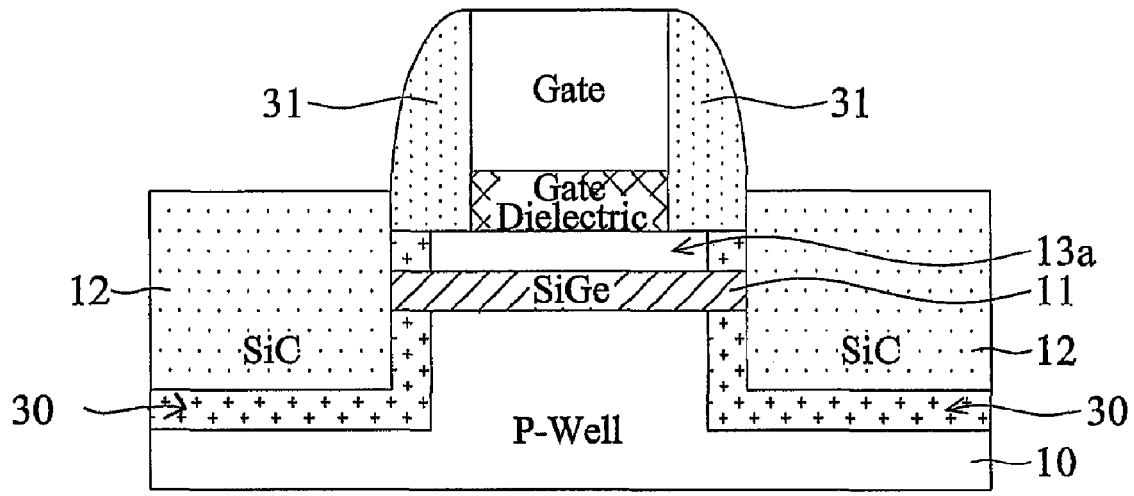
FIG. 3 diagrammatically illustrates the strained channel transistor of FIG. 1 in more detail according to exemplary embodiments of the invention.
Figure 4:
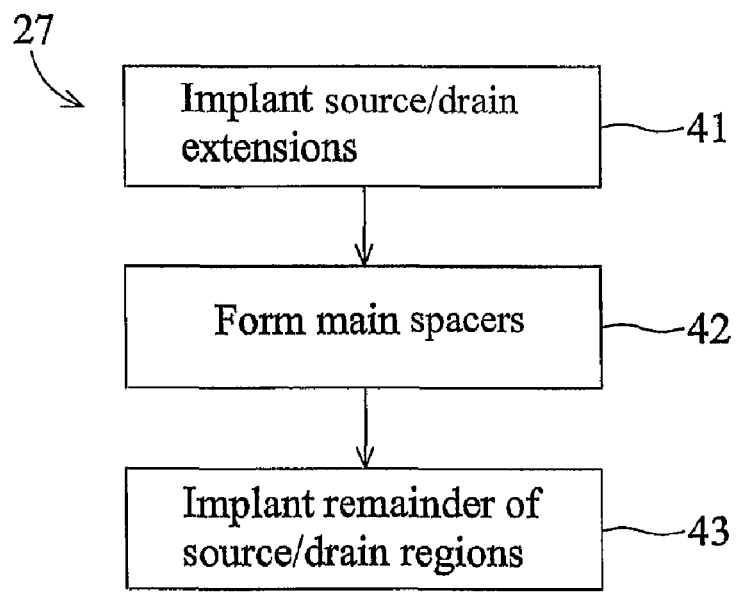
FIG. 4 illustrates a portion of FIG. 2 in more detail according to exemplary embodiments of the invention.
Figure 5:
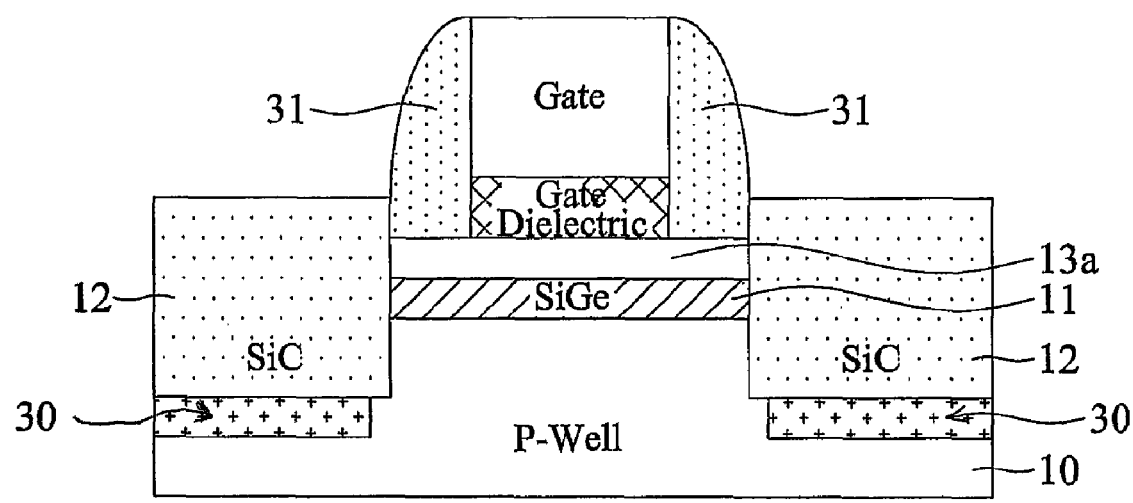
FIG. 5 diagrammatically illustrates the strained channel transistor of FIG. 1 in more detail according to exemplary embodiments of the invention.

The source and drain regions according to various embodiments are illustrated in more detail in FIGS. 3 and 5. As shown in FIG. 3, in some embodiments, the second stressors 12 are contained completely within the respectively corresponding source and drain regions 30. FIG. 5 illustrates exemplary embodiments wherein the second stressors 12 overlap the respectively corresponding source and drain regions 30, but are not contained completely within the source and drain regions 30. The second stressors 12 in FIG. 5 contact the first stressor 11, but the source and drain regions 30 are offset laterally outwardly from the first stressor 11. The arrangements of FIGS. 3 and 5 can be produced, according to some embodiments, by suitably selecting the thickness (width) of the dummy spacers used to position the second stressors 12 (see also 23 in FIG. 2). More specifically, for example, a set of relatively thicker dummy spacers will produce the structure of FIG. 3, and set of relatively thinner dummy spacers will produce the structure of FIG. 5.

Figure 6:
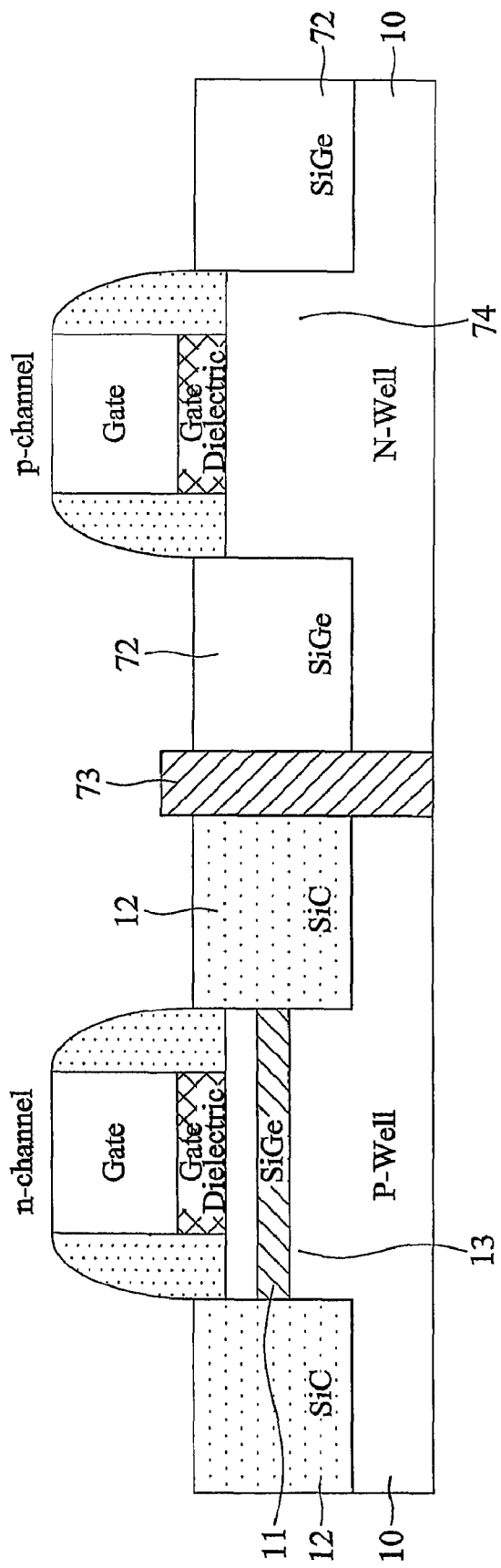
FIG. 6 diagrammatically illustrates a pair of strained channel transistors, including a strained channel transistor such as shown in FIG. 1, 3 or 5, according to exemplary embodiments of the invention.

FIG. 6 diagrammatically illustrates a pair of strained channel transistors, for example a CMOS pair, according to exemplary embodiments of the invention. The transistor pair of FIG. 6 includes a strained n-channel transistor such as described above with respect to any of FIGS. 1, 3 and 5, a strained p-channel transistor that includes third stressors 72, and an isolation structure 73 positioned between the transistors. The third stressors 72 of the strained p-channel transistor have a lattice constant that is greater than that of the semiconductor substrate 10, so the third stressors 72 are cooperable to produce a compressive stress in the channel region 74 of the p-channel transistor. As mentioned previously, a compressive stress in the channel region of a p-channel transistor can enhance the performance of the transistor. In some embodiments, the strained p-channel transistor of FIG. 6 is formed using techniques such as described in U.S. Patent Application Publication No. 2005/0035409 for forming a strained PMOS transistor with lateral stressors. In some embodiments, the third stressors 72 of the strained p-channel transistor have the same material composition as the first stressor 11 of the strained n-channel transistor of FIG. 6, for example, a composition such as $Si_{1-x}Ge_x$ described above.

Although exemplary embodiments of the invention have been described above in detail, this does not limit the scope of the invention, which can be practiced in a variety of embodiments.

What is claimed is:

1. A semiconductor integrated circuit apparatus, comprising:
    a semiconductor substrate;
    a first stressor in said semiconductor substrate;
    a first strained channel transistor over the first stressor, said first strained channel transistor including a first strained channel region, and said first strained channel transistor including second stressors disposed on respectively opposite sides of said first strained channel region, said second stressors in contact with said first stressor and at least a portion of the substrate under the first stressor, said first strained channel region including a strained channel portion that permits carrier movement therethrough, wherein said first stressor has a first lattice constant, said strained channel portion has a second lattice constant, and said second stressors have a third lattice constant, and wherein said first lattice constant is greater than said second lattice constant, and said third lattice constant is less than said second lattice constant, and wherein the first strained channel transistor further includes source and drain regions formed from portions of the semiconductor substrate, wherein said source and drain regions enclose said second stressors and are in contact with said first stressor; and
    a second strained channel transistor in said semiconductor substrate, said second strained channel transistor including a second strained channel region being located within a first material of the semiconductor substrate, the first material having a first composition extending into the semiconductor substrate further than the first stressor, and third stressors disposed on respectively opposite sides of said second strained channel region, wherein the third stressors have said first lattice constant.

2. The apparatus of claim 1, wherein said first and second strained channel transistors are respectively n-channel and p-channel transistors.

3. The apparatus of claim 1, wherein said second stressors at each side of the first strained channel region are cooperable to apply tensile stress to said strained channel portion.

4. The apparatus of claim 1, wherein the first strained channel region comprises silicon, the first stressor comprises germanium, and the second stressors comprise carbon.

5. The apparatus of claim 1, wherein the second stressors are cooperable to apply tensile stress to the first strained channel region.

6. The apparatus of claim 1, wherein the first stressor applies tensile stress to the first strained channel region.

7. The apparatus of claim 1, wherein the second stressors comprise $Si_{1-x}C_x$ or $Si/Si_{1-x}C_x$.

8. The apparatus of claim 1, wherein the first stressor has a thickness greater than approximately 30 angstroms.

9. The apparatus of claim 1, wherein the first strained channel region has a thickness greater than approximately 50 angstroms.

* * * * *